(12) United States Patent
Sekiya

(10) Patent No.: US 9,082,712 B2
(45) Date of Patent: Jul. 14, 2015

(54) DEVICE WAFER PROCESSING METHOD

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/480,894

(22) Filed: Sep. 9, 2014

(65) Prior Publication Data

US 2015/0072507 A1    Mar. 12, 2015

(30) Foreign Application Priority Data

Sep. 12, 2013   (JP) ................................. 2013-188990

(51) Int. Cl.
| | |
|---|---|
| *H01L 21/304* | (2006.01) |
| *H01L 21/683* | (2006.01) |
| *H01L 21/78* | (2006.01) |
| *H01L 23/58* | (2006.01) |
| *H01L 23/544* | (2006.01) |

(52) U.S. Cl.
CPC .......... *H01L 21/304* (2013.01); *H01L 21/6836* (2013.01); *H01L 21/78* (2013.01); *H01L 23/544* (2013.01); *H01L 23/585* (2013.01)

(58) Field of Classification Search
CPC . H01L 21/302; H01L 21/304; H01L 21/6836; H01L 21/78; H01L 21/782; H01L 21/784
USPC ....................... 438/7, 110, 113, 114, 462–465
See application file for complete search history.

(56) References Cited

U.S. PATENT DOCUMENTS

2012/0100696 A1 *   4/2012   Nakamura .................... 438/463

FOREIGN PATENT DOCUMENTS

JP          2005-086074          3/2005

* cited by examiner

*Primary Examiner* — Thanhha Pham
(74) *Attorney, Agent, or Firm* — Greer Burns & Crain Ltd.

(57) ABSTRACT

A device wafer has a plurality of devices individually formed in a plurality of separate regions on the front side of the wafer, the separate regions being defined by a plurality of crossing division lines. The wafer is processed by imaging the front side of the wafer to detect and store a target pattern, holding the front side of the wafer and grinding the back side of the wafer to thereby reduce the thickness to a predetermined thickness, imaging the front side of the wafer and next positioning the wafer with respect to a ring frame according to the target pattern stored so that the wafer is oriented to a predetermined direction, and attaching an adhesive tape to the back side of the wafer to thereby mount the wafer through the adhesive tape to the ring frame.

2 Claims, 7 Drawing Sheets

DEVICE WAFER PROCESSING METHOD

BACKGROUND OF THE INVENTION

1. Field of the Invention

The present invention relates to a device wafer processing method of processing a device wafer having a plurality of devices formed on the front side.

2. Description of the Related Art

The back side of a device wafer having a plurality of devices formed on the front side is ground to reduce the thickness of the device wafer to a predetermined thickness. Thereafter, a transfer step is performed in such a manner that a dicing tape as an adhesive tape is attached to the back side of the device wafer to thereby mount the device wafer through the dicing tape to a ring frame, and a protective tape attached to the front side of the device wafer prior to grinding the back side of the device wafer is next removed. Thereafter, the device wafer with the dicing tape is divided into individual device chips by using a cutting apparatus or a laser processing apparatus, for example. In mounting the device wafer to the ring frame, it is necessary to establish a predetermined positional relation therebetween. Conventionally, the device wafer is positioned with respect to the ring frame on the basis of a mark indicating the crystal orientation of the device wafer.

However, in the case of forming a cutout such as a notch and an orientation flat on the outer circumference of the device wafer, the number of devices that can be formed on the device wafer is decreased. In particular, the orientation flat is a large cutout. Accordingly, in the case of a wafer having a diameter of eight inches or 12 inches widely used in recent years, the orientation flat is replaced by the notch as a smaller cutout. However, in the case of a wafer having a notch formed on the outer circumference, there is a possibility that the wafer may be cracked from the notch in a heat treatment step or the like to be performed in forming the devices on the wafer. To cope with this problem, there has been examined a method of forming a mark indicating the crystal orientation on the back side of a wafer in place of the notch.

SUMMARY OF THE INVENTION

However, the mark formed on the back side of the wafer is ground off in the back grinding step of reducing the thickness of the wafer to a predetermined thickness, so that there is no reference in positioning the wafer with respect to the ring frame in the transfer step. In a cutting apparatus or a laser processing apparatus, the wafer is positioned with respect to the ring frame. Accordingly, unless the wafer is mounted to the ring frame with a predetermined orientation, there is a possibility of trouble in performing alignment for detecting a processing position in the cutting apparatus or the laser processing apparatus.

It is therefore an object of the present invention to provide a device wafer processing method which can mount a device wafer to a ring frame with a predetermined orientation even in the case that the device wafer has no notch, orientation flat, etc.

In accordance with an aspect of the present invention, there is provided a device wafer processing method of processing a device wafer having a plurality of devices individually formed in a plurality of separate regions on the front side of the device wafer, the separate regions being defined by a plurality of crossing division lines, the device wafer processing method including a target pattern storing step of imaging the front side of the device wafer to detect and store a target pattern; a protective tape attaching step of attaching a protective tape to the front side of the device wafer after performing the target pattern storing step; a grinding step of holding the front side of the device wafer through the protective tape after performing the protective tape attaching step and next grinding the back side of the device wafer to thereby reduce the thickness of the device wafer to a predetermined thickness; a positioning step of imaging the front side of the device wafer after performing the grinding step and next positioning the device wafer with respect to a ring frame according to the target pattern stored by performing the target pattern storing step so that the device wafer is oriented to a predetermined direction; and a transfer step of attaching an adhesive tape to the back side of the device wafer after performing the positioning step to thereby mount the device wafer through the adhesive tape to the ring frame and next removing the protective tape from the front side of the device wafer.

Preferably, the device wafer processing method further includes a dividing step of dividing the device wafer along the division lines after performing the transfer step.

According to the device wafer processing method of the present invention, the device wafer is imaged to detect and store a target pattern. The device wafer is next positioned with respect to the ring frame according to the target pattern stored above as the reference so that the device wafer is oriented to a predetermined direction. Thereafter, the device wafer is mounted through the adhesive tape to the ring frame. Accordingly, although the device wafer has no notch, orientation flat, etc., the device wafer can be mounted to the ring frame with a predetermined orientation.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
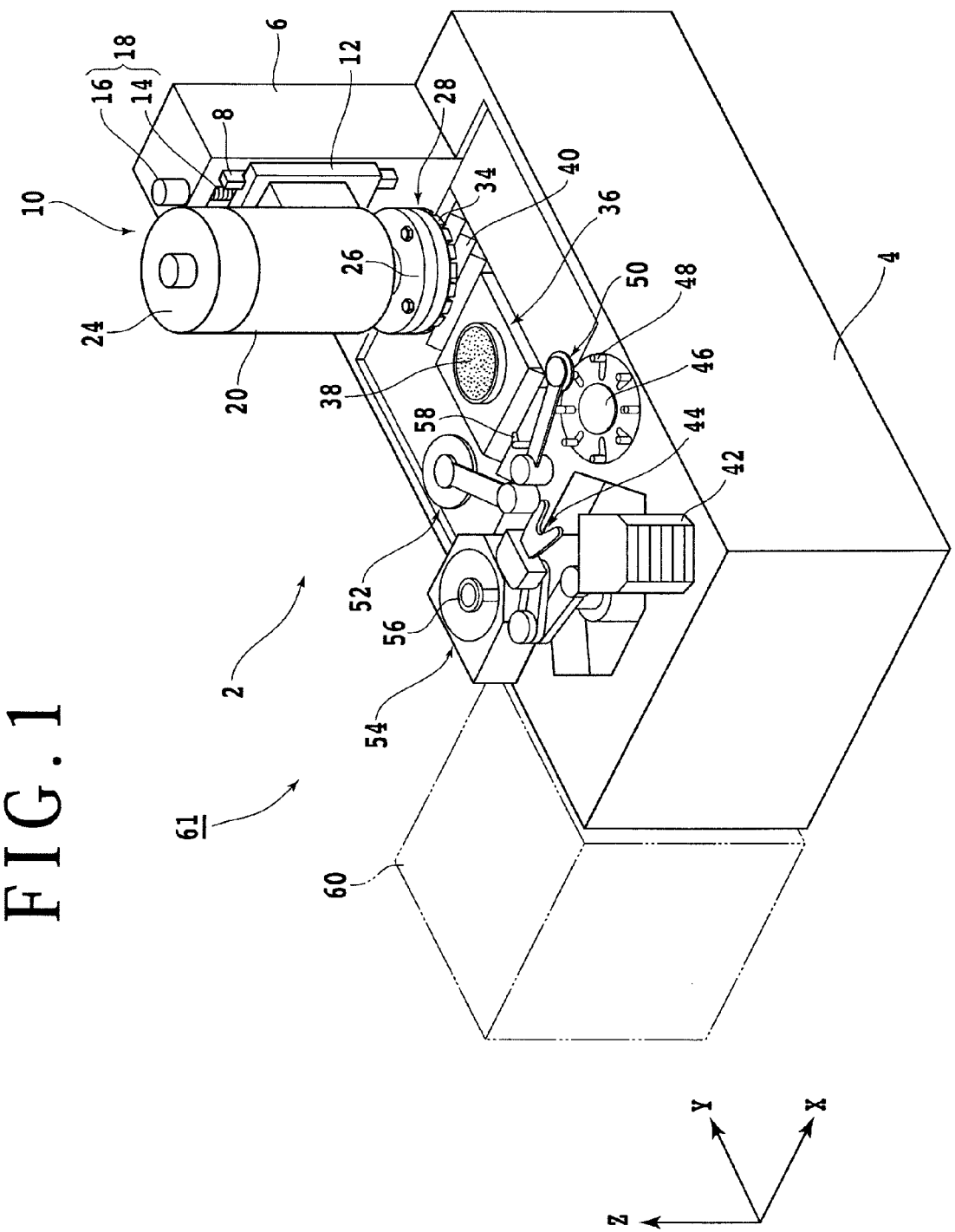
FIG. 1 is a perspective view showing an inline system composed of a grinding apparatus and a tape mounter.

A preferred embodiment of the present invention will now be described in detail with reference to the drawings. Referring to FIG. 1, there is shown a perspective view of an inline system 61 composed of a grinding apparatus 2 and a tape mounter 60 inline connected with each other. The tape mounter 60 is schematically shown to illustrate the positional relation with respect to the grinding apparatus 2. Reference numeral 4 denotes a base (housing) of the grinding apparatus 2. A column 6 is provided at a rear end portion of the base 4 so as to vertically extend from the upper surface of the base 4.

A pair of guide rails (only one of which being shown) 8 are fixed to the front surface of the column 6 so as to extend vertically.

Figure 4:
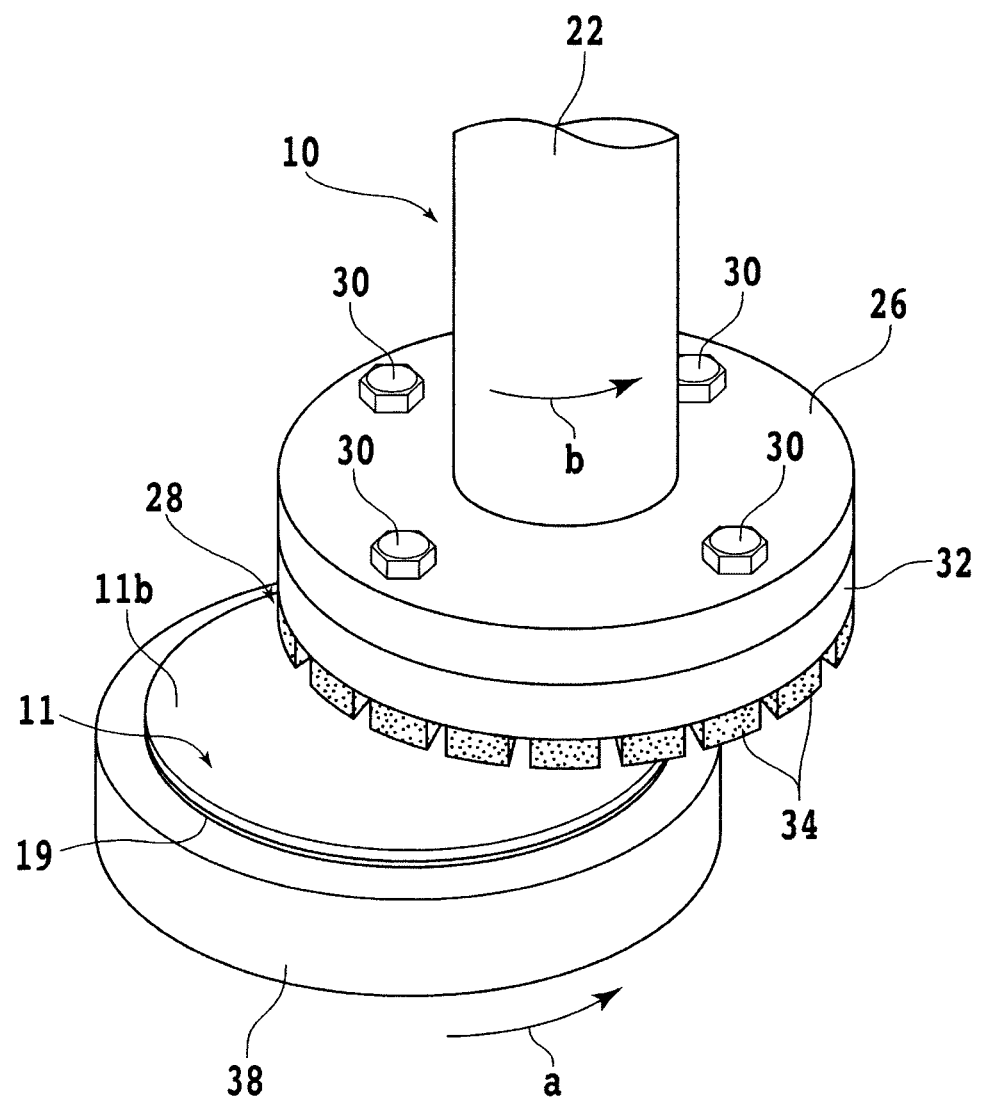
FIG. 4 is a perspective view showing a grinding step.

A grinding unit (grinding means) 10 is supported to the column 6 so as to be vertically movable. More specifically, the grinding unit 10 includes a housing 20 and a movable base 12 vertically movable along the guide rails 8. The housing 20 is fixedly mounted on the movable base 12. The movable base 12 is adapted to be moved by a grinding unit moving mechanism 18 including a ball screw 14 and a motor 16 for rotating the ball screw 14. The grinding unit 10 further includes a spindle 22 (see FIG. 4) rotatably provided in the housing 20, a servo motor 24 for rotationally driving the spindle 22, and a wheel mount 26 fixed to the lower end of the spindle 22. As shown in FIG. 4, a grinding wheel 28 is detachably mounted on the lower surface of the wheel mount 26 by a plurality of screw 30. The grinding wheel 28 is composed of an annular wheel base 32 and a plurality of abrasive members 34 fixed to the lower surface of the annular wheel base 32 so as to be annularly arranged at given intervals.

Referring back to FIG. 1, a chuck table mechanism 36 having a chuck table 38 is provided at a central portion of the base 4 so as to be exposed to the upper surface of the base 4. The chuck table 38 is adapted to be moved in the Y direction by a chuck table moving mechanism (not shown) provided in the base 4. Reference numeral 40 denotes a bellows type cover for covering the chuck table moving mechanism. There are provided at a front portion of the base 4 a wafer cassette 42 storing a plurality of device wafers to be ground by the grinding unit 10, a wafer handling robot 44, a positioning mechanism 46 having a plurality of positioning pins 48, a wafer loading mechanism (loading arm) 50, a wafer unloading mechanism (unloading arm) 52, and a spinner cleaning unit 54 having a spinner table 56.

Further, a cleaning water nozzle 58 for cleaning the chuck table 38 is provided on the immediately front side of the chuck table 38 in its wafer loading/unloading position shown in FIG. 1. That is, the cleaning water nozzle 58 functions to direct a cleaning water toward the chuck table 38 set in the wafer loading/unloading position. The tape mounter 60 is located adjacent to the spinner cleaning unit 54. The tape mounter 60 functions to attach a dicing tape as an adhesive tape to the device wafer processed by the grinding apparatus 2 and mount the peripheral portion of the dicing tape to a ring frame. The grinding apparatus 2 and the tape mounter 60 are arranged in an inline manner such that the device wafer processed by the grinding apparatus 2 can be mounted through the dicing tape to the ring frame so as to establish a predetermined positional relation.

Figure 2:
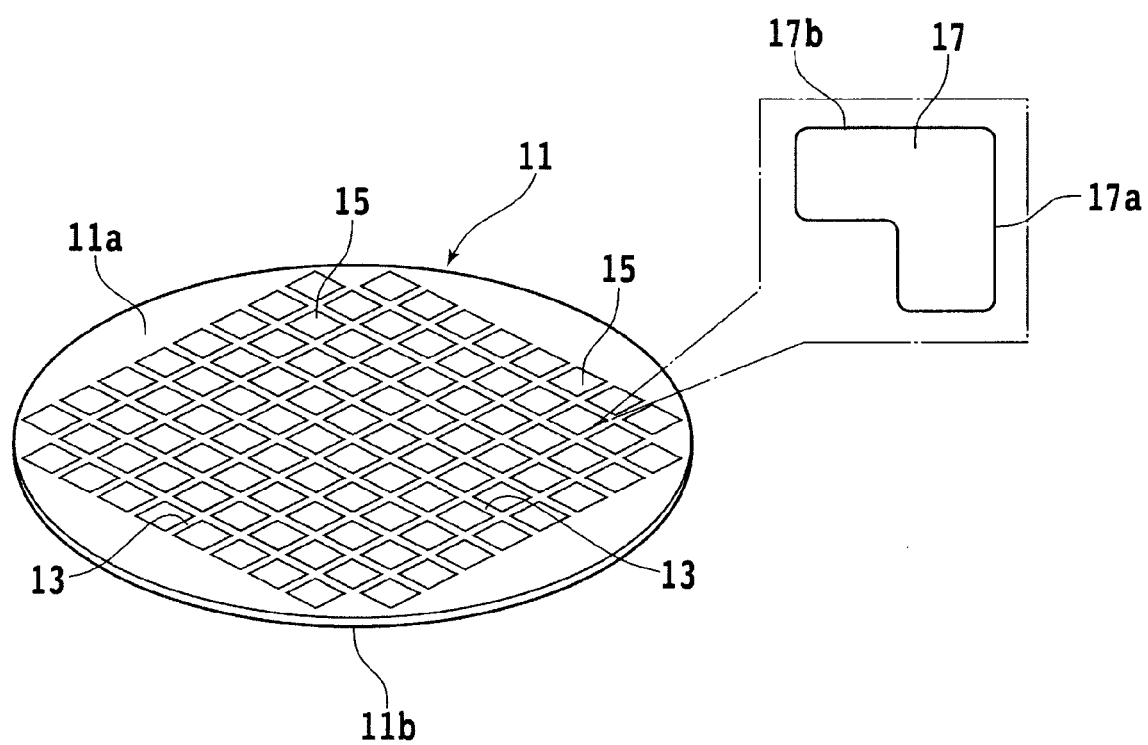
FIG. 2 is a perspective view of a device wafer having a plurality of devices each having a target pattern.

Referring next to FIG. 2, there is shown a perspective view of a device wafer 11 in the condition where the front side 11a of the device wafer 11 is seen. A plurality of crossing division lines (streets) 13 are formed on the front side 11a of the device wafer 11 to thereby define a plurality of separate regions where a plurality of devices 15 such as LSIs are individually formed. Each device 15 includes an electronic circuit such as an LSI formed by a plurality of patterns. A pattern 17 to be easily used for alignment is selected as a target pattern from the plural patterns in each device 15. This target pattern 17 selected above is stored in a memory (target pattern storing step).

This selection of the target pattern 17 is made by an operator using an imaging unit (not shown) including a microscope and a camera to image the front side 11a of the device wafer 11. The condition required for the selection of the target pattern 17 is that at least one side 17a of the target pattern 17 is parallel to the division lines 13 extending in a first direction.

In this preferred embodiment, the target pattern 17 has another side 17b perpendicular to the side 17a. Accordingly, the side 17b is parallel to the other division lines 13 extending in a second direction perpendicular to the first direction.

Figure 3:
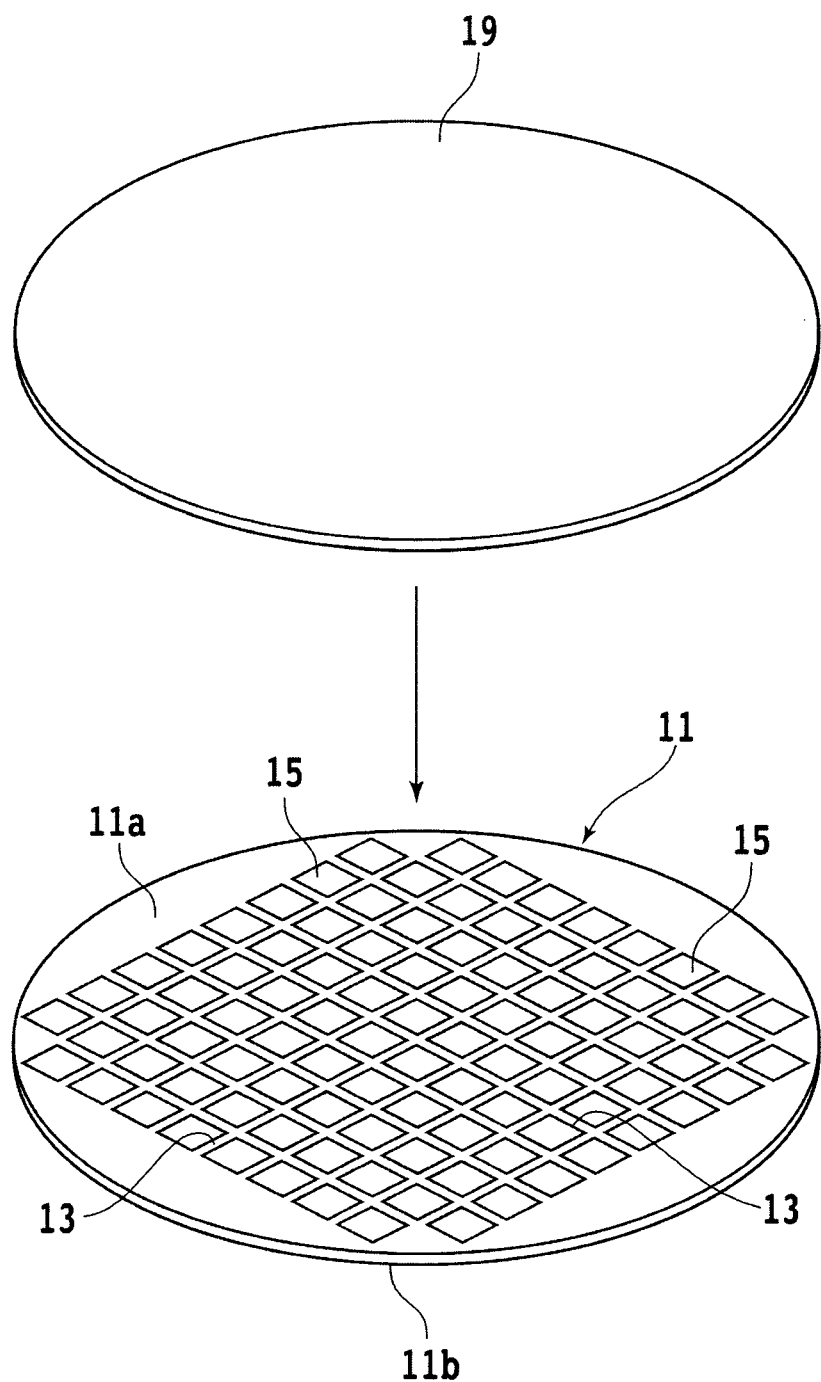
FIG. 3 is a perspective view showing a protective tape attaching step.

In performing the device wafer processing method according to this preferred embodiment, a protective tape attaching step is performed as shown in FIG. 3 in such a manner that a protective tape 19 is attached to the front side 11a of the device wafer 11. The protective tape 19 functions to protect the devices 15 formed on the front side 11a of the device wafer 11 in grinding the back side 11b of the device wafer 11. After performing the protective tape attaching step, a grinding step is performed in such a manner that the back side 11b of the device wafer 11 is ground to reduce the thickness of the device wafer 11 to a predetermined thickness. This grinding step is performed by the grinding unit 10 of the grinding apparatus 2.

More specifically, as shown in FIG. 4, the device wafer 11 with the protective tape 19 attached to the front side 11a is held under suction on the chuck table 38 of the grinding apparatus 2 in the condition where the protective tape 19 is in contact with the chuck table 38 and the back side 11b of the device wafer 11 is exposed. Thereafter, the chuck table 38 is moved from the wafer loading/unloading position shown in FIG. 1 to a grinding position just below the grinding unit 10. In this grinding position, the chuck table 38 is rotated in the direction shown by an arrow a in FIG. 4 at 300 rpm, for example, and the grinding wheel 28 is also rotated in the same direction as the rotational direction of the chuck table 38, i.e., in the direction shown by an arrow b in FIG. 4 at 6000 rpm, for example. Further, the grinding unit moving mechanism 18 is operated to bring the abrasive members 34 of the grinding wheel 28 into contact with the back side 11b of the device wafer 11. Thereafter, the grinding wheel 28 is fed downward by a predetermined amount at a predetermined feed speed, thereby grinding the back side 11b of the device wafer 11. In grinding the back side 11b of the device wafer 11, a contact type or noncontact type thickness gauge (not shown) is used to measure the thickness of the device wafer 11 until the thickness of the device wafer 11 is reduced to a desired thickness, e.g., 100 μm.

After performing the grinding step by the use of the grinding wheel 28 as mentioned above, the chuck table moving mechanism (not shown) is driven to move the chuck table 38 to the wafer loading/unloading position shown in FIG. 1. Thereafter, the device wafer 11 processed by the grinding step is carried by the unloading arm 52 from the chuck table 38 to the spinner table 56 of the spinner cleaning unit 54. That is, the device wafer 11 is held under suction by the unloading arm 52, and the unloading arm 52 is pivotally rotated about a vertical axis to thereby carry the device wafer 11 to the spinner table 56. Accordingly, the device wafer 11 is held under suction on the spinner table 56 in the condition where the protective tape 19 attached to the front side 11a of the device wafer 11 is in contact with the spinner table 56 as shown in FIG. 5.

Thereafter, the spinner table 56 is rotated at a predetermined speed in the condition where the device wafer 11 is held under suction on the spinner table 56, and a cleaning water such as pure water is supplied to the device wafer 11 to perform spin cleaning of the device wafer 11. Thereafter, spin drying is performed to the device waver 11 as blowing a compressed air or the like to the device wafer 11.

Figure 5:
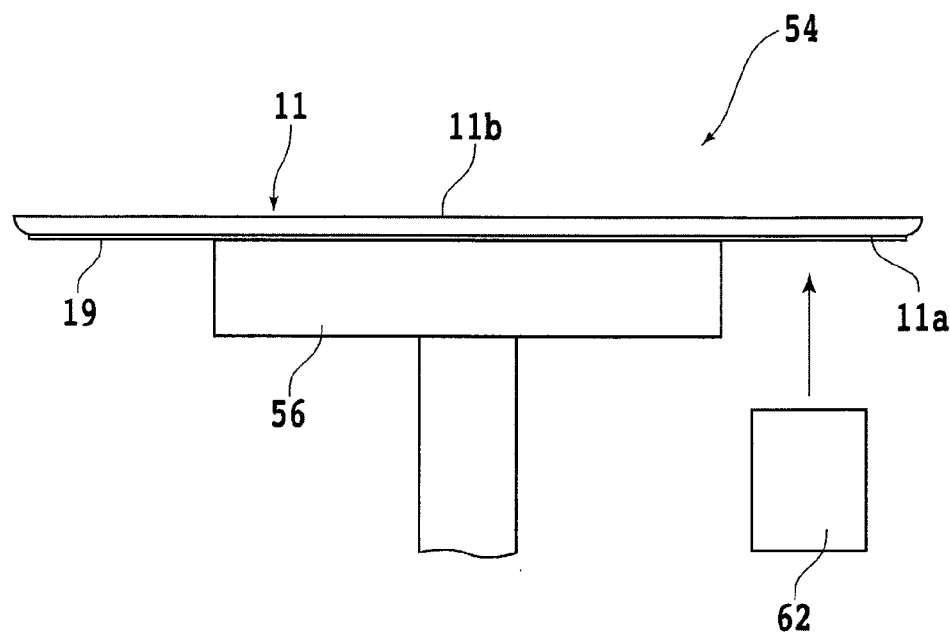
FIG. 5 is a side view for illustrating a positioning step.

Thereafter, the front side 11a of the device wafer 11 is imaged through the protective tape 19 by using an imaging unit 62 having a microscope and a camera provided below the spinner table 56 as shown in FIG. 5, thereby detecting the target pattern 17 previously stored in the target pattern storing step. The protective tape 19 is composed of a transparent resin base sheet formed of polyolefin or the like and a rubber or acrylic adhesive layer formed on the front side of the transparent resin base sheet. Accordingly, the front side 11a of the device wafer 11 can be imaged through the protective tape 19 by using an ordinary camera capable of imaging with visible light. The imaging unit 62 has a waterproof structure because it is located in the environment where the cleaning water scatters. As a modification, in the case that the imaging unit 62 is composed of a microscope and an infrared camera, the imaging unit 62 may be located above the spinner table 56. In this case, the target pattern 17 formed on the front side 11a of the device wafer 11 held on the spinner table 56 can be detected by the infrared camera.

Figure 7:
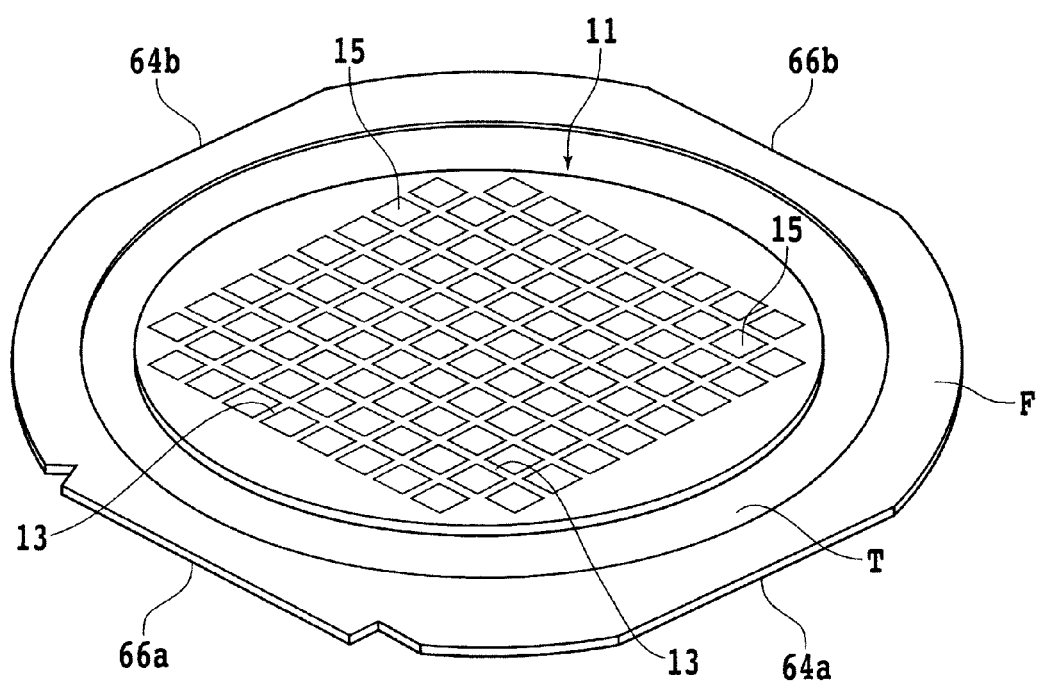
FIG. 7 is a perspective view of the device wafer in the condition where it is supported through a dicing tape to a ring frame by performing the transfer step.

After detecting the target pattern 17 formed in each device 15, the spinner table 56 is rotated so that the side 17a of the target pattern 17 in the device wafer 11 held on the spinner table 56 is oriented so as to establish a predetermined positional relation with respect to the ring frame F (see FIG. 7) placed on the tape mounter 60 (positioning step). As shown in FIG. 7, the ring frame F has a pair of first flat cut portions 64a and 64b extending parallel to each other and a pair of second flat cut portions 66a and 66b extending parallel to each other at right angles to the first flat cut portions 64a and 64b.

After performing the positioning step mentioned above, the wafer handling robot 44 operates to hold the device wafer 11 under suction and carry it from the spinner table 56 stopped at a predetermined rotational position to the tape mounter 60 located adjacent to the grinding apparatus 2 in an inline manner. At this time, the device wafer 11 is turned upside down by the operation of the wafer handling robot 44 so that the protective tape 19 attached to the front side 11a of the device wafer 11 is oriented upward, and the wafer handling robot 44 performs an expansion/contraction operation and a swing operation to carry the device wafer 11 to the tape mounter 60. Further, since the swing angle of the wafer handling robot 44 is preliminarily set, the plural device wafers 11 can be always carried to the same position on the tape mounter 60 with the same attitude.

The dicing tape T as the adhesive tape is preliminarily attached to the ring frame F as shown in FIG. 7. The ring frame F thus supporting the dicing tape T is preliminarily set at a predetermined position on the tape mounter 60. On the other hand, the spinner table 56 is stopped at a predetermined rotational position so that the side 17a of the target pattern 17 detected by the imaging unit 62 is oriented to a predetermined direction. Accordingly, the device wafer 11 carried by the wafer handling robot 44 can be attached to the dicing tape T so that the division lines 13 extending in the first direction on the device wafer 11 become parallel to the first flat cut portions 64a and 64b of the ring frame F.

Figure 6:
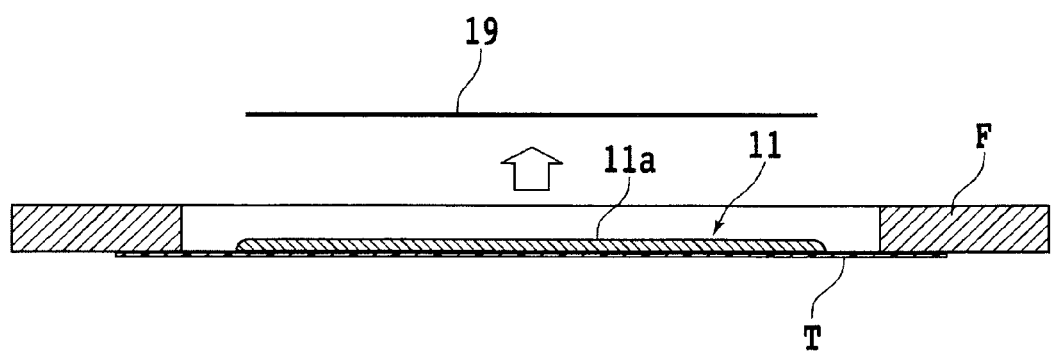
FIG. 6 is a sectional view showing a transfer step.

After attaching the device wafer 11 to the dicing tape T supported to the ring frame F in the condition where the device wafer 11 is oriented so as to establish a predetermined positional relation with respect to the ring frame F, the protective tape 19 is removed from the front side 11a of the device wafer 11 as shown in FIG. 6. In other words, the device wafer 11 is transferred from the protective tape 19 to the dicing tape T, so that the above-mentioned series of steps of attaching the device wafer 11 to the dicing tape T and next removing the protective tape 19 from the device wafer 11 are herein referred to as a transfer step. FIG. 7 is a perspective view of the device wafer 11 in the condition where it is supported through the dicing tape T to the ring frame F by performing the transfer step.

Figure 8:
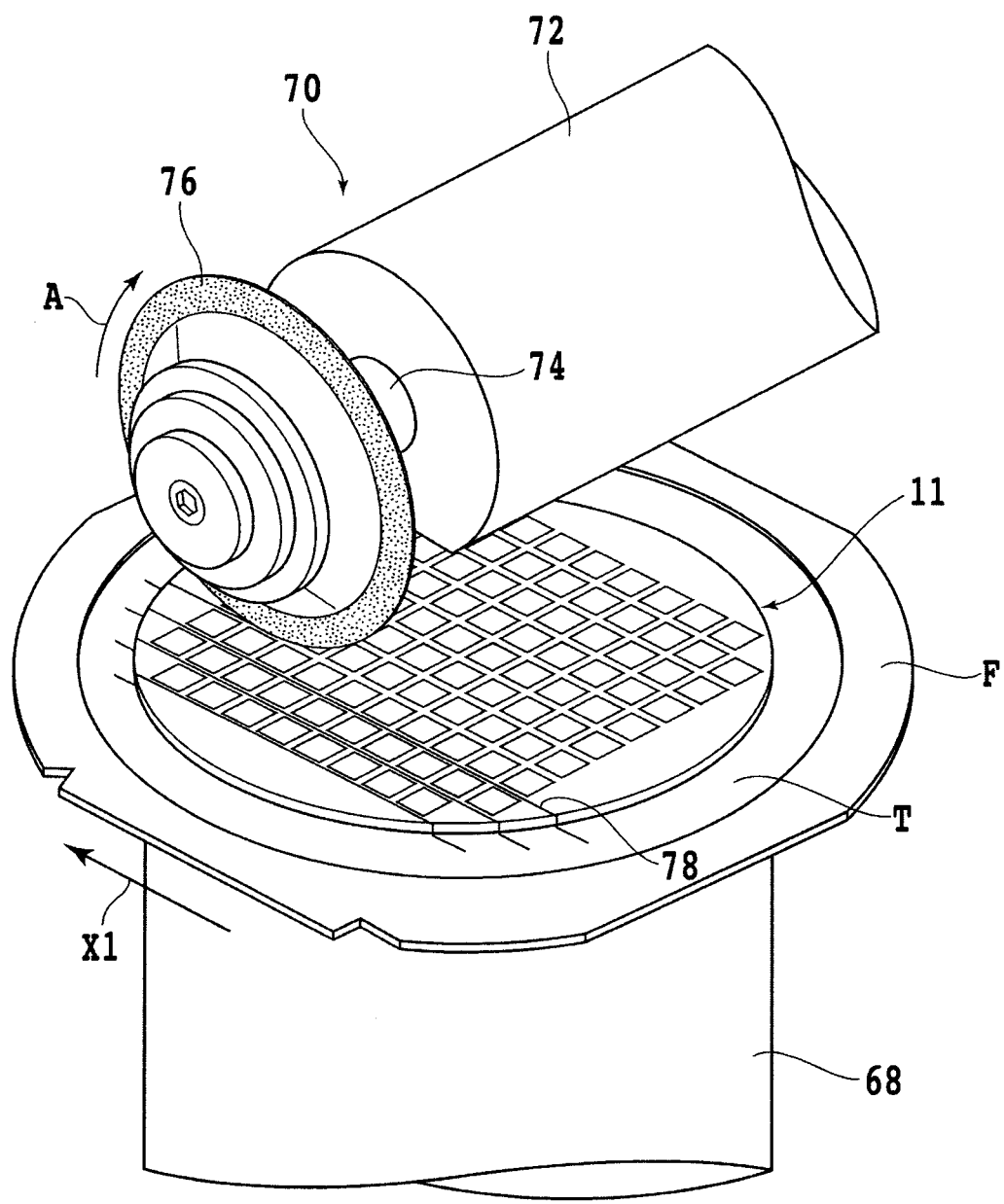
FIG. 8 is a perspective view showing a dividing step.

After performing the transfer step, a dividing step is performed in such a manner that the device wafer 11 is cut along each division line 13 by using a cutting apparatus having a cutting unit 70 shown in FIG. 8. As shown in FIG. 8, the cutting unit 70 of the cutting apparatus includes a spindle housing 72, a spindle 74 rotatably supported in the spindle housing 72, and a cutting blade 76 mounted on the front end portion of the spindle 74.

The cutting apparatus further includes a chuck table 68 for holding the device wafer 11 under suction. In performing the dividing step, the device wafer 11 is held through the dicing tape T on the chuck table 68 under suction. Thereafter, the cutting blade 76 is rotated at a high speed in the direction shown by an arrow A in FIG. 8, and then lowered to cut the device wafer 11 in the condition where the cutting blade 76 is aligned with a predetermined one of the division lines 13 extending in the first direction. At this time, the cutting blade 76 is lowered until reaching the dicing tape T. Thereafter, the chuck table 68 is fed in the direction shown by an arrow X1 in FIG. 8, so that the device wafer 11 is cut by the cutting blade 76 along the predetermined division line 13 to form a cut groove 78 along this division line 13.

Thereafter, the cutting unit 70 is indexed by the pitch of the division lines 13 in the direction perpendicular to the X1 direction to similarly cut the device wafer 11 along all of the division lines 13 extending in the first direction. Thereafter, the chuck table 68 is rotated 90 degrees to similarly cut the device wafer 11 along all of the other division lines 13 extending in the second direction perpendicular to the first direction. As a result, the device wafer 11 is divided into a plurality of individual device chips corresponding to the devices 15.

The dividing step of dividing the device wafer 11 is not limited to the dividing step using the cutting blade 76 mentioned above, but may include a laser processing step such as ablation and modified layer formation using a laser processing apparatus. In the latter case, a modified layer is formed as a division start point inside the device wafer 11 along each division line 13 by applying a laser beam, and an external force is next applied to the device wafer 11 to thereby divide the device wafer 11 along each modified layer.

In this preferred embodiment, the positioning step of positioning the device wafer 11 with respect to the ring frame F according to the target pattern 17 previously stored so that the device wafer 11 is oriented to a predetermined direction is performed in the spinner cleaning unit 54 of the grinding apparatus 2. As a modification, this positioning step may be performed on the tape mounter 60 in the following manner.

For example, the device wafer 11 is placed on an inspection table (temporary setting table) provided on the tape mounter 60, and the front side 11a of the device wafer 11 is imaged by an imaging unit. Thereafter, the inspection table is rotated so as to make the side 17a of the target pattern 17 formed on each device 15 parallel to the first flat cut portions 64a and 64b of the ring frame F placed on the tape mounter 60, thereby positioning the device wafer 11 with respect to the ring frame F. Thereafter, the device wafer 11 is attached to the dicing tape T supported to the ring frame F, and the protective tape 19 is next removed from the front side 11a of the device wafer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device wafer processing method of processing a device wafer having a plurality of devices individually formed in a plurality of separate regions on a front side of said device wafer, said separate regions being defined by a plurality of crossing division lines, said device wafer processing method comprising:

a target pattern storing step of imaging the front side of said device wafer to detect and store a target pattern;

a protective tape attaching step of attaching a protective tape to the front side of said device wafer after performing said target pattern storing step;

a grinding step of holding the front side of said device wafer through said protective tape after performing said protective tape attaching step and next grinding a back side of said device wafer to thereby reduce the thickness of said device wafer to a predetermined thickness;

a positioning step of imaging the front side of said device wafer after performing said grinding step and next positioning said device wafer with respect to a ring frame according to said target pattern stored by performing said target pattern storing step so that said device wafer is oriented to a predetermined direction; and a transfer step of attaching an adhesive tape to the back side of said device wafer after performing said positioning step to thereby mount said device wafer through said adhesive tape to said ring frame and next removing said protective tape from the front side of said device wafer.

2. The device wafer processing method according to claim 1, further comprising a dividing step of dividing said device wafer along said division lines after performing said transfer step.

* * * * *